United States Patent [19]

Cogar et al.

[11] Patent Number: 4,609,613
[45] Date of Patent: Sep. 2, 1986

[54] PERMANENT REPRODUCTIONS AND FORMATION METHOD THEREFOR

[75] Inventors: George R. Cogar, Frankfort, N.Y.; Robert E. Markle, Rancho Palos Verdes, Calif.

[73] Assignee: Permanent Images, Inc., Herkimer, N.Y.

[21] Appl. No.: 595,631

[22] Filed: Mar. 29, 1984

Related U.S. Application Data

[63] Continuation of Ser. No. 221,167, Dec. 29, 1980, abandoned.

[51] Int. Cl.⁴ ............................ G03C 5/00; G03C 7/00
[52] U.S. Cl. ...................................... 430/320; 430/272; 430/275; 430/278; 430/321; 430/322; 430/325; 430/326; 430/357; 430/367; 430/374; 430/524; 430/525; 430/526
[58] Field of Search ................ 430/313, 272, 357, 273, 430/367, 275, 374, 278, 524, 322, 325, 541, 525, 526, 320, 11, 17, 15, 14, 321, 326

[56] References Cited

U.S. PATENT DOCUMENTS

| | | | |
|---|---|---|---|
| 2,115,339 | 4/1938 | Mason | 430/526 |
| 2,766,119 | 10/1956 | Freedman et al. | 430/526 |
| 3,405,017 | 10/1968 | Gee | 430/313 |
| 3,830,686 | 8/1974 | Lehrer | 430/17 |
| 3,925,079 | 12/1975 | Hager et al. | 430/465 |
| 4,008,084 | 2/1977 | Ikeda et al. | 430/276 |
| 4,029,509 | 6/1977 | Blake | 430/524 |
| 4,094,679 | 6/1978 | Washizawa et al. | 430/323 |
| 4,246,328 | 1/1981 | Sato et al. | 430/17 |
| 4,276,368 | 6/1981 | Heller et al. | 430/313 |
| 4,292,393 | 9/1981 | Wada et al. | 430/313 |

FOREIGN PATENT DOCUMENTS 1514420 6/1978 United Kingdom .

Primary Examiner—Mary F. Downey
Attorney, Agent, or Firm—Harry M. Weiss & Associates

[57] ABSTRACT

Permanent gray-scale reproductions including half-tone images. A refractory background region bears refractory thin-film dichroic filter means patterned to conform to the reproduced half-tone image. Preferred background region materials include metals, semiconductors, and ceramics; the thin-film materials are preferably oxides or nitrides of metals and semiconductors. If the refractory materials are appropriately selected, the reproductions are highly resistant to chemical and thermal deterioration and should have useful lives in the hundreds of thousands of years.

2 Claims, 5 Drawing Figures

THIN FILM vs SUBSTRATE
INDEX OF REFRACTION

THIN FILM vs SUBSTRATE
INDEX OF REFRACTION

PHASE SHIFT
vs
FILM THICKNESS

HALFTONE PROCESS

PERMANENT REPRODUCTIONS AND FORMATION METHOD THEREFOR

This application is a continuation of application Ser. No. 221,167, filed 12/29/80, now abandoned.

BACKGROUND OF THE INVENTION

1. Field of the Invention

This invention relates generally to permanent gray-scale reproductions and more particularly relates to permanent reproductions of half-tone monochrome images.

2. Description of the Prior Art

Reproductions such as photographic prints and ink-based prints degrade significantly upon exposure to light, extremes of temperature, chemical corrosion, and active biological agents. Significant quality degradation may occur in days to decades depending on the nature of the ambient. When such reproductions are used outdoors, they must either be renewed periodically or suitably sealed. Sealing in general deteriorates image quality as the integrity of the seal increases, and does not preclude photochemical and thermal degradation.

The best-known alternative reproduction technique for enhanced lifetime is metal-based intaglio. By stamping or chemical-etching a metallic background material, images of limited quality may be reproduced. Only etching is practical for fine detail. Neither stamping nor etching is compatible with refractory background materials, so there is a fundamental tradeoff between image quality (e.g. resolution) and permanence in this technology. In addition, the image is reproduced by textural variations and thus does not have a true gray-scale.

SUMMARY OF THE INVENTION

It is a primary object of this invention to provide an improved reproduction which has both high resolution and greatly improved longevity in hostile environments.

It is yet another object of this invention to provide a gray-scale reproduction of a half-tone monochrome image using thin films.

It is yet a further object of this invention to provide a permanent gray-scale reproduction of a half-tone image using thin films.

It is yet an additional object of this invention to provide a permanent gray-scale reproduction of a half-tone monochrome image with a choice of colors using thin films.

By refractory is meant inorganic materials selected for their permanence in the intended environment.

In accordance with one embodiment of this invention, there is disclosed a permanent image comprising a background region of a substantially reflective refractory metal, semiconductor, or ceramic, bearing dichroic refractory thin-film means which is patterned to correspond to a predetermined half-tone image. By suitable selection of the index of refraction and thickness of the thin film means, which is preferably a transparent insulator, variation of the monochrome color is possible. The reflective background material, which may also serve as the support means, provides a reproduction viewed in the reflective mode with front lighting.

In accordance with another embodiment of the invention, there is disclosed a permanent image comprising a substantially transparent refractory background material bearing refactory thin-film means patterned to correspond to a predetermined half-tone image. The transparent background material, which may also serve as the support means, allows viewing of the reproduction by back-lighting in the transmissive mode.

In accordance with yet another embodiment of the invention, there is disclosed a permanent image comprising refractory background material bearing thin films means having two different thicknesses corresponding to a predetermined half-tone image. This embodiment permits modification of the color of the background region.

The foregoing and other objects, features, and advantages of the invention will be apparent from the following, more particular, description of the embodiments of the invention, as illustrated in the accompanying drawings.

THE SPECIFICATION

Figure 1:
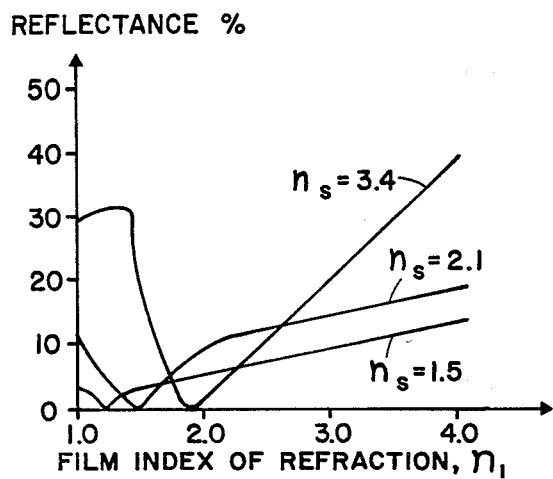
FIG. 1 illustrates the variation in reflectance of a thin-film layer on a substantially reflecting substrate as a function of the indices of refraction for both the film and the substrate.

In a photograph or an inked reproduction, the visible image results from the contrast between regions where incident light is absorbed in the ink or emulsion, and background regions where incident light is reflected. The reproduction of the present invention is based on contrast produced by interference effects in a transparent thin-film layer located over a reflective or partially reflective background material. Referring to FIG. 1, there is shown the reflectance of such a combination for three different indices of refraction of $n_s$ of the background material versus the thin-film index of refraction $n_1$. The light reflected from the thin film and the light transmitted through the thin film and reflected from the background region will combine destructively if the phase shift on double passage through the film is an odd multiple of $\pi$ radians.

FIG. 1 illustrates the variation in reflectance in the case of destructive interference, for example where the film is a quarter-wave plate at the wavelength of the observation. At unity abscissa, the reflectance is that of the background region, and increases with its index of refraction. As the film index of refraction increases, the reflectance falls to zero when $n_1 = \sqrt{n_s}$, corresponding to a matched thin film. As $n_1$ increases above $n_s$, reflection from the thin film increases and there is no phase shift at the film-background interface. In that case there is constructive interference for a quarter-wave film thickness.

As will be described in more detail hereinafter, the observed color will be determined by the relative phase shifts of the incident spectrum. As may be seen from FIG. 1, contrast suitable for image reproduction corresponding to portions of the background free of the thin film ($n_1 = 1$) versus portions covered by the thin film ($n_1 > 1$) may be achieved by a high reflectance background region selectively overlaid with a quarter-wave film having a lower index of refraction than the background region and preferably being matched to the background region (corresponding to the reflectance minima in FIG. 1).

Figure 2:
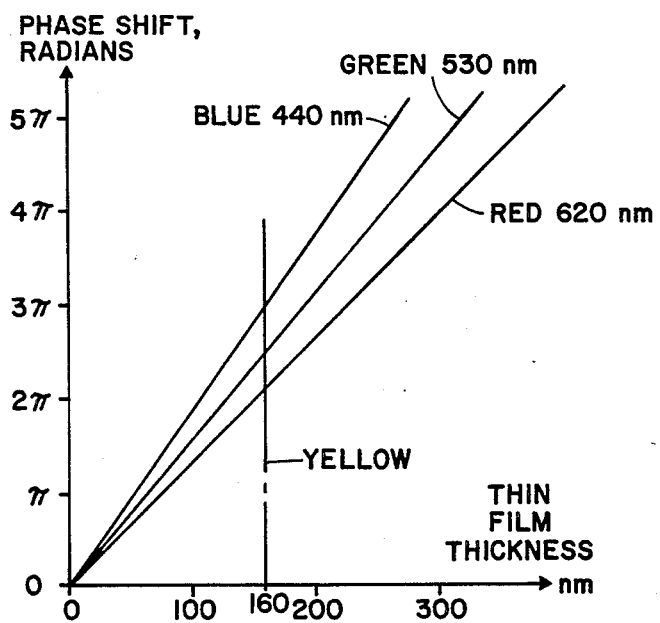
FIG. 2 shows the phase shift through the thin-film versus its thickness with color as a parameter for specified indices of refraction.

Referring now to FIG. 2, phase shift is shown as a function of film thickness for the system silicon nitride on silicon. Wavelength is a parameter; the primary colors are indicated. Destructive interference occurs for odd multiples of $\pi$ radians ($\pi$ itself corresponding to a quarter-wave film) and constructive interference occurs for even multiples of $\pi$ radians. FIG. 2 is thus suggestive of ways to vary color in a monochrome image. For example, if the film thickness is 160 nanometers, the film will be destructive of blue ($3\pi$) and constructive of red ($2\pi$), with some loss of green, resulting in a low density yellow. Green and red may be de-emphasized ($3\pi$) at about 190 and 230 nanometers respectively to produce yet other colors.

Yet another possibility is suggested by FIG. 2. For this system, there is relatively little dispersion at either $\pi$ or $2\pi$ radians. Thus a quarter-wave film will be quite dark, and may be used in conjunction with either the background region alone or with a half-wave film to provide a black and white image.

Figure 3:
FIG. 3 is illustrative of gray-scale obtention by the half-tone technique.

Referring now to FIG. 3, obtention of a gray-scale by the half-tone process is illustrated. A pattern of black dots of uniform density on a white background is shown; the area of each square occupied by the black dots increases from left to right. Were FIG. 3 reduced to the point where the individual dots were no longer capable of resolution by the eye, the result would be a triplet of areas appearing light gray, medium gray, and dark gray. By combining such areas with totally white and totally black areas, one obtains a gray-scale limited solely by the resolution with which the black dots may be defined. For purposes of this application, gray-scale means a range of densities achievable with any two colors and is not limited to black and white.

Figure 4A:
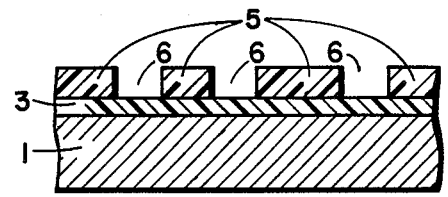
FIGS. 4A and 4B are sectional views of a preferred embodiment of the invention including a method for forming the image.
Figure 4B:
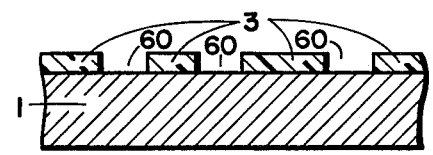

Preferred embodiments of the invention are now described. Referring to FIGS. 4A and 4B, a portion of a reproduction and its formation are described.

In FIG. 4A, 1 is the background region, which may be of sufficient thickness to provide the primary support means for the reproduction. Suitable materials for the background region include metals, semiconductors, and ceramics, especially germanium silicon, gallium arsenide, alumina, and sapphire. The background region has a sufficiently smooth surface to admit of the deposition of a uniform thin-film 3 over the area of the desired reproduction. However, the surface should be sufficiently rough to break the mirror effect which degrades the whiteness of the desirably reflective regions and reduces the acceptable span of viewing angles. The background material preferably has a matte finish. Thin-film 3 has a thickness of from one to several quarter-wave lengths in the desired spectrum. Typical thin-films include the oxides and nitrides of metals and semiconductors, preferably silicon monoxide, silicon dioxide, silicon nitride, tantalum oxide, titanium oxide; or alumina. Useful thicknesses for such materials are from 50 to 1000 nanometers. Subject to the necessary thickness uniformity, almost any thin film could be used which has a useful match with the background region in terms of color and contrast.

Atop thin-film 3 is formed a layer 5 of photosensitive material which is exposed to produce a multiplicity of openings 6 corresponding to the desired image including a half-tone image. Etching by any suitable means using the patterned photosensitive layer 5 as a mask results in corresponding openings 60 (see FIG. 4B) in the thin-film 3. Where the image is a half-tone image, the area of the openings is proportional to the local intensity of the image.

While the invention has been particularly shown and described with reference to preferred embodiments thereof, it will be understood by those skilled in the art that modifications thereto are within the scope of the invention. Many such alternatives have already been suggested in the portion of the specification leading up to the description of the preferred embodiments. While particular materials have been described for their known suitability for the permanent reproduction, other materials may be used subject to optical compatible described hereinbefore and to the further requirement that such materials be refractory in the sense that they resist the contemplated ambient. Thus, other changes in form and detail may be made to the invention without departing from its spirit and scope which is recapitulated in the following summary.

SUMMARY

The permanent reproductions of this invention depend on interference and reflection effects where a thin-film having a thickness equal to an odd number of quarter-wavelengths of the viewing light overlies predetermined portions of a background region having an index of refraction different from that of the thin-film. As shown in FIG. 1 where $n_1 = 1$ corresponding to the absence of the thin film, the background region material is preferably chosen to have a high reflectance depending on the index of refraction $n_s$. For a thin-film having a thickness equal to an odd multiple of a quarter-wavelength and an index of refraction less than that of a substantially-reflective background region, reflection from the portions covered by the thin-film may be minimized.

As explained particularly with reference to FIG. 2, the color of the thin-film region may be modified by changing its thickness. Thus, in a reflective display like that of FIG. 4, one may have a substantially white background region and a monochrome (substantially black or one of a range of colors) for the portions covered by the thin film. The intensity of the monochrome regions may be modified by providing them with sub-visible reflective sub-portions (absence of thin film) according to a predetermined half-tone image.

We claim:
1. A method for forming a permanent reproduction of a half-tone color image comprising:
   selecting a substantially reflecting inorganic refractory substrate having a first index of refraction, said substrate being selected from the group consisting of silicon, germanium, gallium arsenide, sapphire, and alumina;
   depositing a substantially transparent inorganic thin film coating having a second index of refraction onto said substrate, where the second index of refraction is less than the first index of refraction and said thin film is selected from the group consisting of silicon nitride, silicon monoxide, silicon dioxide, alumina, tantalum oxide, and titanium oxide;
   building the deposit of said thin film to a thickness substantially equal to an odd number of quarter wavelengths of the viewing light for determining the color and quality of the resulting image, said thin film thickness being in the range of 50–1000 nanometers;

coating the thin film with a photosensitive mask;

selectively exposing the mask to form the half-tone image in the photosensitive layer;

developing the exposed mask areas; and etching to produce the desired pattern of openings in the thin film wherein the area of the openings is proportional to the local intensity of the image formed.

2. The method accordingly to claim 1, where said second index of refraction is substantially equal to the square root of said first index of refraction.

* * * * *